Sept. 9, 1958 E. W. HEROLD 2,851,594
FREQUENCY CONVERTER USING FOUR-ZONE TRANSISTOR AS OSCILLATOR-MIXER
Filed May 9, 1956
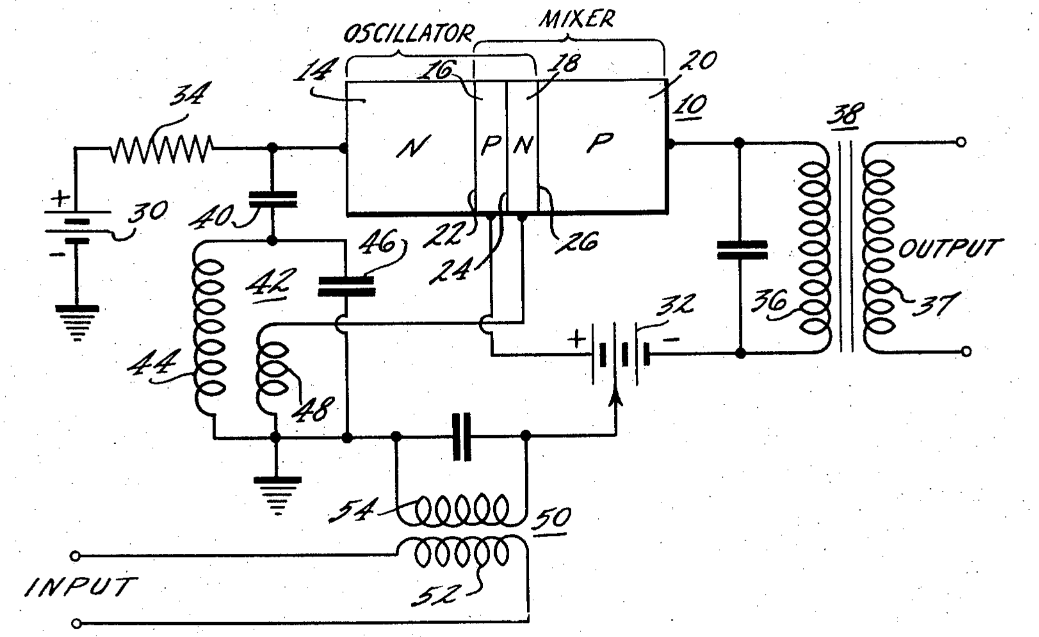
INVENTOR.
Edward W. Herold
BY
H. C. Newton
ATTORNEY.

United States Patent Office 2,851,594

Patented Sept. 9, 1958

2,851,594

FREQUENCY CONVERTER USING FOUR-ZONE TRANSISTOR AS OSCILLATOR-MIXER

Edward W. Herold, Princeton, N. J., assignor to Radio Corporation of America, a corporation of Delaware Application May 9, 1956, Serial No. 583,825

7 Claims. (Cl. 250—20)

This invention relates to semi-conductor signal translating circuits and in particular to transistor frequency converter circuits for use in superheterodyne signal receiving systems and the like.

Conventional signal receiving systems of the superheterodyne type require some means for converting the received modulated carrier wave into a corresponding intermediate frequency wave. Frequency converter circuits for accomplishing this type operation may include an oscillator for developing a beat frequency wave or local oscillator signal, and a mixer for mixing the local oscillator signal with the received carrier wave. The oscillator may include one electron discharge tube or transistor, while the mixer may include another and separate electron discharge tube or transistor. Alternatively, a frequency converter may consist of a single electron discharge tube of the pentagrid type or a single transistor in which separate oscillator and mixer sections are coupled together. Disadvantages of conventional single transistor frequency converters may include their relatively low gain and relative inefficiency.

It is accordingly an object of the present invention to provide an improved frequency converter circuit having a single semi-conductor device or transistor for developing a local oscillator signal and mixing with an applied carrier wave to produce a desired intermediate or beat frequency signal.

It is another object of the present invention to provide an improved and simplified frequency converter circuit having a single junction transistor which operates to provide efficient signal conversion of a received carrier wave to a beat or intermediate frequency signal.

It is yet another object of the present invention to provide an improved frequency converter having a single semi-conductor device and a circuit arrangement utilizing a minimum number of circuit elements and connections, which is relatively efficient and stable in operation.

These and other objects in accordance with the invention are achieved in a frequency converter circuit which utilizes a transistor of a type having adjacent regions or zones of opposite conductivity semi-conductor material. The barriers between the zones are so biased that the second and third zones are emitter electrodes and the first and fourth zones are collector electrodes. In this manner, the first three zones operate as one triode transistor and the second, third, and fourth zones operate as a second triode transistor which is of an opposite conductivity type to the first transistor. By appropriate circuit connections, the first transistor is operative as the active element of a local oscillator circuit. By applying a signal to the second transistor, signal mixing is achieved and an output intermediate or beat frequency signal is developed.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which the single figure is a schematic circuit diagram of a frequency converter circuit embodying the invention.

Referring to the drawing, the frequency converter circuit shown, has for its active element a semi-conductor device or transistor 10 including a body of semi-conductor material, for example, germanium, silicon or the like, having four regions 14, 16, 18, and 20 of alternating conductivity types, arranged in N–P–N–P order in the present example. If desired, the regions may be in P–N–P–N order providing the polarity of biasing voltages, later referred to, is reversed. A rectifying barrier 22 separates the regions 14 and 16. A junction or barrier 24 separates the regions 16 and 18 and a rectifying barrier 26 separates the regions 18 and 20. The barrier 24 is preferably, but not necessarily a good rectifier since it is normally used to inject minority carriers from region 18 into region 16 and vice versa. The regions 14, 16, 18 and 20 may be made by a conventional crystal growing operation in which a seed crystal touches molten germanium, for example, of P-type conductivity material and as crystallization starts the seed is slowly withdrawn to form the region 20. N-type impurity material is then added to the molten germanium in sufficient quantity to produce the N-type material of the region 18. The regions 16 and 14 may be formed in a similar fashion. Alternatively, the P-type and N-type regions 16 and 18 may be formed by a crystal growing operation and then the appropriate N-type and P-type regions may be formed by an alloying or fusion process of the type described generally in a paper by Law et al. entitled "A Developmental Germanium P–N–P Junction Transistor" in the November 1952 issue of the Proceedings of the IRE. As still another alternative, the P and N regions 16 and 18 may be formed by a crystal growing operation and the electrodes represented by the regions 14 and 20 may be in the form of cat whiskers or plates or films of a metal in rectifying contact with the emitter regions 16 and 18.

The semi-conductor device or transistor 10 comprises two transistors, one of which includes the regions 16 (emitter), 18 (base), and 20 (collector), and the other of which includes the regions 18 (emitter), 16 (base), and 14 (collector). The transistors so-formed are of opposite conductivity types. The second and third regions 16 and 18 are operated as emitter electrodes in their separate transistors and, in addition, each functions as the base region for the other. Accordingly, the regions 16 and 18 are preferably made to have a thickness smaller than a diffusion length for minority charge carriers therein. In effect, therefore, the spacing between the emitter and collector of each transistor is less than the diffusion length. A thickness of 2 mils or less is suitable for most purposes. The thicknesses of the regions 14 and 20, which are operated as collector electrodes, are not critical.

To provide biasing potentials for the transistor 10, a pair of batteries 30 and 32 are provided. The negative terminal of the battery 30 is grounded and its positive terminal is connected through a resistor 34 to the N-type region 14. The negative terminal of the battery 32 is connected through the primary winding 36 of a tuned output circuit 38, to the P-type region 20, while the positive terminal of this battery is connected directly to the region 16. The polarity of the biasing voltages are selected so that the N-type region 14 is biased in the non-conducting or reverse direction with respect to the P-type region 16, while the region 18 is biased in the conducting or forward direction with respect to the P-type region 16. Thus the first, second, and third regions 14, 16, and 18 are properly biased to comprise the collector, base, and emitter regions, respectively, of a first transistor. The region 16 is biased in the forward or conducting direction with respect to the region 18 and the region 20 is biased in the non-conducting reverse direction with respect to the region 18. Thus the second, third, and fourth regions 16, 18, and 20 are properly biased to comprise the emitter, base, and collector regions of a second transistor.

The transistor which comprises the first, second, and third regions 14, 16, and 18 is used, in accordance with the invention, as the active element of a local oscillator circuit. To this end, the region 14 (collector) is coupled through a coupling capacitor 40 and a parallel-resonant tuned circuit 42, comprising an inductor 44 and a capacitor 46, to a point of reference potential or circuit ground. To provide a feedback connection for sustained oscillation, a feedback coupling winding or inductor 48 is provided which is connected between the region 18 (emitter) and ground and which is in inductive coupling relation with the inductor 44 of the tuned circuit 42. The oscillator circuit including the first transistor is thus seen to be of the common base type, the region 14 (collector) serving as an output electrode and the region 18 (emitter) serving as an input electrode, while the region 16 (base) is common to the input and output circuits. Feedback of sufficient amplitude and proper phase to sustain continuous oscillations is provided by feeding back signals from the collector to the emitter electrodes through the inductive coupling of coils 44 and 48 which are so connected that the feedback is in regenerative phase.

The signal mixing function of converter circuits embodying the invention is provided by the second transistor which includes the second, third, and fourth regions 16, 18, and 20, respectively. An input signal such as a carrier-wave signal is applied through an input circuit 50 which includes a primary winding 52 and a tuned secondary winding 54. The signals so applied are coupled between the region 16 (base) and the region 18 (emitter) of the second transistor. The second transistor comprising the regions 16, 18, and 20 is thus operated as a common emitter transistor with the base regions serving as the input electrode. The region 20 (collector) is the output electrode of the second transistor and is connected with the tuned primary winding 36 of the output transformer 38, which also includes a secondary winding 37.

In operation, the first transistor unit comprising the regions 14, 16, and 18 will generate a local oscillator signal, as explained above, due to the regenerative feedback between the regions 14 and 18 which is of proper phase and sufficient amplitude to sustain continuous oscillation. The local oscillator signal so generated is applied between the regions 16 and 18 (emitter and base, respectively) of the second transistor unit which operates as a signal mixer. The input signal modulated-carrier wave which is applied to the circuit through the input circuit 50 is also applied between the emitter and base regions 16 and 18 of the second transistor unit. The mixer portion of the transistor, that is the transistor comprising the regions 16, 18, and 20, will normally be operated with a sufficiently large voltage from the oscillator coil 48 so that it is nonlinear. The output signal which appears in the collector or output circuit of the second transistor will thus contain one or more of the usual sum and difference frequencies of input and local oscillator and the other modulation components as well. One or more of these components is chosen for the tuning of output circuit 38. In a superheterodyne receiver, the chosen component is known as the intermediate frequency.

Physically, the P-type emitter region 16 injects charge carriers or holes into the N-type base region 18 and these holes are collected by the collector P-type region 20 in conventional fashion to provide an output current. At the same time, the N-type region 18 which is also operated as an emitter electrode injects charge carriers (electrons) into the P-type base region 16. If region 14 were not present, as in an ordinary transistor, any electrons thus injected would be wasted. By using a device of the type described, however, these electrons are now collected by the N-type collector region 14 and produce a useful output current for the oscillator portion of the circuit. It is no longer necessary to keep this current small, since it now serves a useful purpose. Thus, converter circuits embodying the invention are relatively efficient in operation. Because there is a separation of function between oscillator and mixer sections, the circuits of the invention are advantageous compared with hitherto used circuits for conventional triode transistors.

While one type of converter circuit has been illustrated, the oscillator and mixer circuit connections may be changed within the scope of the invention. In any event one transistor comprising three regions or zones will generate a local oscillator signal which will be mixed with the applied carrier wave by the second transistor. As described, therefore, frequency converter circuits embodying the invention are characterized by the simplicity of their circuit connections, by relatively efficient signal conversion, and by the isolation of oscillator and mixer portions of the semi-conductor device.

What is claimed is:

1. A frequency converter circuit comprising, in combination; a semi-conductor device consisting solely of a semi-conductive body comprising first, second, third, and fourth zones alternating in conductivity type; means providing biasing voltages between said first and second zones and said third and fourth zones in the reverse relatively non-conducting direction and between said second and third zones in the forward relatively conducting direction to provide emitter electrodes at said second and third zones and collector electrodes at said first and fourth zones; said first, second, and third zones being operative as a first three electrode transistor and said second, third, and fourth zones being operative as a second three electrode transistor; means providing an input and output circuit connected with said first transistor; means providing regenerative signal feedback between said output and input circuits for generating a local oscillator signal; input circuit means for applying an input signal to said second transistor for mixing with said local oscillator signal; and output circuit means connected with said second transistor for deriving therefrom an output signal representative of a modulation component of said local oscillator signal and said input signal.

2. A frequency converter circuit comprising, in combination; a semi-conductive body comprising first, second, third, and fourth zones alternating in conductivity type; means providing biasing voltages between said first and second zones and said third and fourth zones in the reverse relatively non-conducting direction and between said second and third zones in the forward relatively conducting direction to provide emitter electrodes at said second and third zones and collector electrodes at said first and fourth zones; said first, second, and third zones being operative as a first three electrode transistor and said second, third, and fourth zones being operative as a second three electrode transistor; means providing an output and input circuit for said first transistor connected with said first and third zones respectively; means providing regenerative signal feedback between said output and input circuits for generating a local oscillator signal; input circuit means connected with said second zone for applying an input signal to said second transistor for mixing with said local oscillator signal; and output circuit means connected with said fourth zone for deriving therefrom an output signal representative of a modulation component of said local oscillator signal and said input signal.

3. A frequency converter circuit comprising, in combination, a semi-conductor device including first, second, third and fourth zones alternating in conductivity type, means providing electrical connections to each zone, a local oscillator circuit and a direct-current supply source included in said connections between said first and third zones and operative therewith to generate a local oscillator signal, an output circuit tunable to an intermediate frequency signal and a direct-current supply source included in the connections between the second and fourth zones, and input circuit means included in said connections between the second and third zones for applying therebetween said local oscillator signal and an input signal.

4. A frequency converter circuit comprising, in combination, a semi-conductor device, including first, second, third and fourth zones alternating in conductivity type, a local oscillator circuit and a direct-current supply source connected between said first and third zones and operative therewith to generate a local oscillator signal, an intermediate frequency output circuit and a direct-current supply source connected between said second and fourth zones, and signal feedback means and a signal input circuit serially connected between the second and third zones for applying said local oscillator signal and an input signal therebetween.

5. In a frequency converter circuit, the combination comprising a semi-conductor device having a first region of one type conductivity semi-conductor material and a second region of an opposite type conductivity semi-conductor material adjacent to each other and forming a junction to provide minority charge carrier injection from one region to the other, said regions having a thickness less than a diffusion length for minority charge carriers and comprising emitter electrodes and base regions one for the other, a third region of said opposite conductivity type in rectifying contact with said first region, a fourth region of said one conductivity type in rectifying contact with said second region, each of said third and fourth regions comprising a collector electrode for one of said emitter electrodes; means providing a signal output circuit connected with said third region; means providing a signal input circuit connected with said second region; means providing regenerative signal coupling between said output and input circuits of phase and magnitude for generating a local oscillator signal; means for applying a received signal between said first and second regions; and means for deriving an output signal from said fourth region representative of a modulation component of said local oscillator and received signals.

6. A frequency converter circuit comprising, in combination; a semi-conductor device including first, second, third and fourth zones alternating in conductivity type;

means providing electrical connections to each zone including a local oscillator circuit and a direct-current supply source connected between said first and third zones; an intermediate-frequency output circuit and a first direct-current supply source connected between said second and fourth zones; and a second direct-current supply source, a feedback coil in inductive coupling relationship with said local oscillator circuit, and a signal input circuit serially connected between said second and third zones.

7. A frequency converter circuit comprising, in combination, a transistor having first, second, third, and fourth zones alternating in conductivity type; means providing biasing voltages between said first and second zones and said third and fourth zones in the reverse relatively non-conducting direction and between said second and third zones in the forward relatively conducting direction to provide emitter electrodes at said second and third zones and collector electrodes at said first and fourth zones; said first, second, and third zones being operative as a first three electrode transistor and said second, third, and fourth zones being operative as a second three electrode transistor; said second zone being operative as a base electrode for said first transistor and said third zone being operative as a base electrode for said second transistor; means providing an output circuit connected with said first zone; means providing an input circuit connected with said third zone; means providing regenerative signal feedback between said output and input circuits for generating a local oscillator signal and applying said local oscillator signal between said second and third zones; input circuit means for applying a received carrier wave between said second and third zones for mixing in said second transistor with said local oscillator signal; and output circuit means connected with said fourth zone for deriving therefrom an output signal representative of a modulation component of said local oscillator signal and said received carrier wave.

References Cited in the file of this patent

UNITED STATES PATENTS 2,569,347 Shockley ---------------- Sept. 25, 1951

OTHER REFERENCES

Electrical Manufacturing, December 1952, page 320.

Design of transistorized High-Gain Portable by Sheehan et al., Electronics, March 1955, pages 159 to 161.